United States Patent [19]
Moody

[11] Patent Number: 5,221,888
[45] Date of Patent: Jun. 22, 1993

[54] CURRENT LIMITED TEMPERATURE RESPONSIVE CIRCUIT

[75] Inventor: Paul T. Moody, Oldham, United Kingdom

[73] Assignee: U.S. Philips Corporation, New York, N.Y.

[21] Appl. No.: 771,390

[22] Filed: Oct. 3, 1991

[30] Foreign Application Priority Data

Oct. 8, 1990 [GB] United Kingdom ............ 9021796.9

[51] Int. Cl.$^5$ .............................................. G05F 3/26
[52] U.S. Cl. .................... 323/315; 361/103; 307/491; 307/591; 323/907
[58] Field of Search ............... 323/315, 316, 317, 907; 361/103; 307/491, 591

[56] References Cited

U.S. PATENT DOCUMENTS 4,769,589 9/1988 Rosenthal ..................... 323/315 X

*Primary Examiner*—Emanuel T. Voeltz
*Attorney, Agent, or Firm*—Bernard Franzblau

[57] ABSTRACT

A temperature responsive circuit (100) has a temperature sensitive device (1), a first current source (2) connected in series with the temperature sensitive device for generating a given current ($I_1$) and a detector (3) having an output (4) for providing a voltage signal ($V_4$) which varies with the temperature sensed by the temperature sensitive device (1). A current-limiting arrangement (6) is connected to the output (4) and includes a current mirror having first and second similar transistors (Q11 and Q7) with the main current path between first and second electrodes ($S_7$ and $d_7$) of the second transistor (Q7) providing an output current $I_{out}$ of the circuit. A second current source (Q10 and Q12) provides a current for the current mirror which is related to the given current ($I_1$) when the voltage at the output of the detector (3) represents a temperature below a critical temperature ($T_c$) and a current which drops with an increase in temperature when the temperature increases beyond the critical temperature $T_c$ to cause the output current $I_{out}$ of the circuit to fall with an increase in temperature beyond the critical temperature.

20 Claims, 1 Drawing Sheet

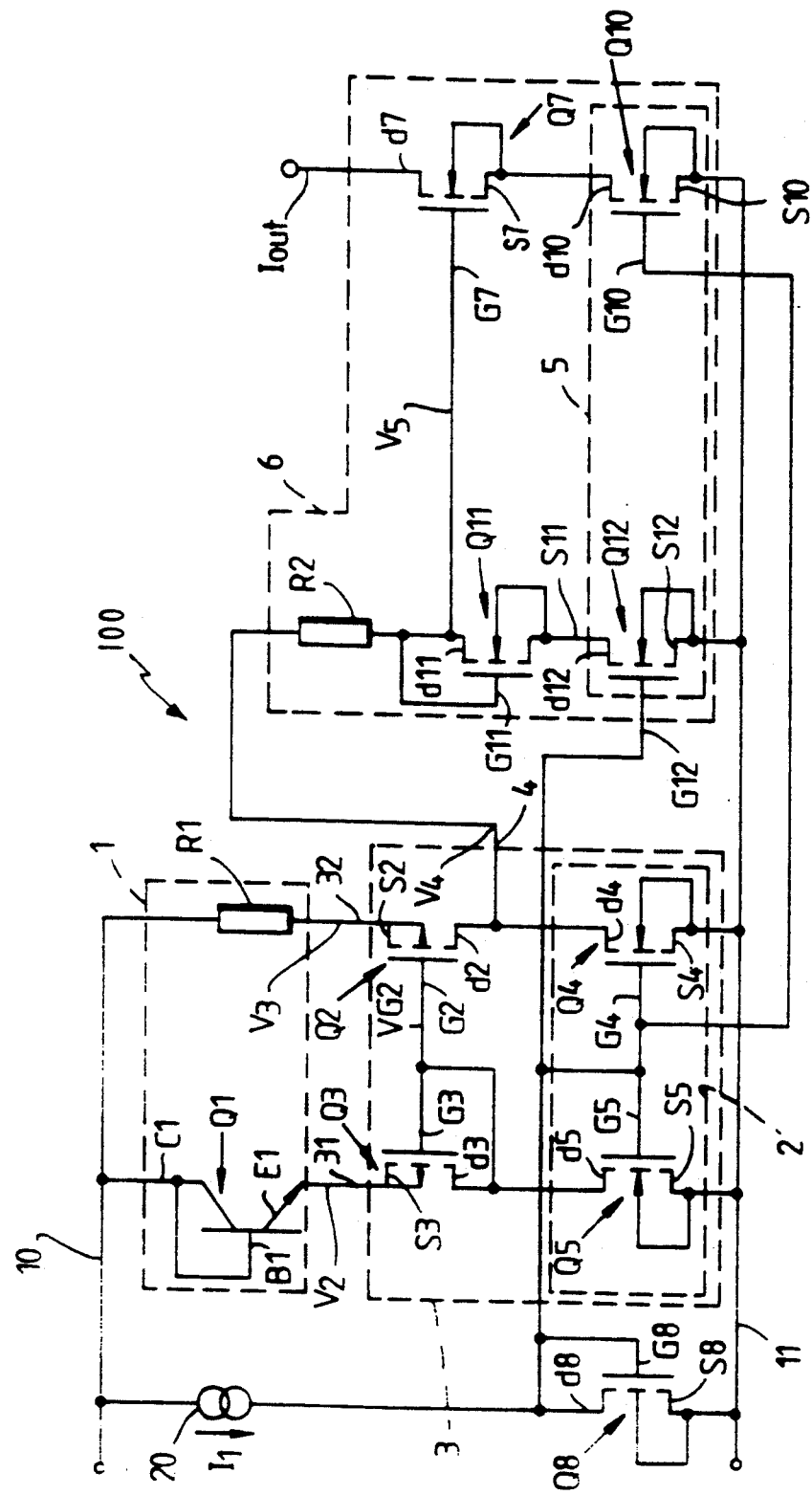

CURRENT LIMITED TEMPERATURE RESPONSIVE CIRCUIT

BACKGROUND OF THE INVENTION

This invention relates to a temperature responsive circuit especially, but not exclusively, suitable for controlling the operation of a power semiconductor device such as a power MOSFET.

EP-A-369530 describes a temperature responsive circuit comprising a temperature sensitive device, a first current source provided in series with the temperature sensitive device and detecting means having an output for providing a voltage signal which varies with the temperature sensed by the temperature sensitive device.

The circuit described in EP-A-369530, which corresponds to U.S. Pat. No. 5,039,878 (Aug. 13, 1991), is provided to determine whether the temperature of an active device, for example, a power semiconductor device in thermal contact with the temperature sensitive device, exceeds a predetermined threshold and to provide an output signal indicating when the predetermined threshold is exceeded.

The use of such temperature sensing circuits is of particular interest in the field of so-called 'smart power' devices in which control functions provided by low voltage logic devices are integrated with power semiconductor devices such as power MOSFETs to provide intelligent power switches for use in high volume applications such as automotive control systems.

In certain overload conditions in such smart power devices, for example, where an overload of low resistance (say about 100 mΩ (milli-ohm) is present, the device is forced into a current-limiting mode. The power semiconductor device, generally a power MOSFET, will then dissipate power and heat up rapidly. Especially where the mounting base temperature of the smart power device is already high, then temperatures within the power MOSFET may quickly exceed safe operating limits.

SUMMARY OF THE INVENTION

It is accordingly an object of the present invention to provide a temperature responsive circuit which provides an output signal enabling the maximum current which can flow through the power MOSFET to be reduced as the temperature of the power MOSFET increases.

According to the present invention, there is provided a temperature responsive circuit comprising a temperature sensitive device, a first current source provided in series with the temperature sensitive device for generating a given current and detecting means having an output for providing a voltage signal which varies with the temperature sensed by the temperature sensitive device, characterised in that a current-limiting arrangement is connected to the output of the detecting means. The current limiting arrangement comprises a current mirror having first and second similar transistors with the main current path between first and second electrodes of the second transistor providing an output current of the circuit and a second current source for providing for the current mirror a current which is related to said given current when the voltage at the output of the detecting means represents a temperature below a critical temperature, and for providing a current which reduces with an increase in temperature beyond the critical temperature to cause the output current of the circuit to fall with an increase in temperature beyond the critical temperature.

A temperature responsive circuit in accordance with the invention thus provides at the circuit output a current output signal which varies with temperature so that, above a predetermined critical temperature sensed by the temperature sensing device, the current supplied at the circuit output reduces with temperature. This current output signal may be used to provide a bias current which may be used to, for example, control the maximum current through an active semiconductor device such as a power MOSFET so that, if the active semiconductor device is forced into a current-limiting mode due to certain overload conditions, the output signal for the temperature responsive circuit limits the maximum current which can flow through the active device and causes this maximum current to reduce with temperature, thereby enabling the temperature of the active semiconductor device to be maintained within safe operating limits. Thus, the current output of a circuit in accordance with the present invention may be used as a reference current which is applied to a second circuit which monitors the current through the active semiconductor device and limits the current through the active semiconductor device to a fixed multiple of the reference current.

It should be understood that as used herein the term 'similar' means that the two devices, for example, two transistors, are integrated together so as to be matched or else related by a known ratio of effective junction areas.

In a preferred example, the first and second transistors each have first and second main electrodes and a control electrode with the control electrode of the second transistor being connected to one of the first and second main electrodes and the control electrode of the first transistor and with the first electrode of the second transistor providing an output of the circuit and the second current source is connected to the second main electrodes of the first and second transistors, the first main electrode of the first transistor being connected via a resistance to the output of the detecting means for causing the voltage at the control electrodes of the first and second transistors to alter with the output voltage of the detecting means. Accordingly, the voltage at the control electrodes of the first and second transistors will be less than, but will alter linearly with the voltage at the output of the detecting means until at the critical temperature the current through the current mirror falls with increasing temperature.

The temperature sensitive device may comprise a first temperature sensitive element having a positive temperature coefficient of resistance and a second temperature sensitive element having a negative temperature coefficient of resistance with each of the temperature sensitive elements being connected in series with the first current generator, and the detecting means may comprise a comparator for comparing the voltage across the first temperature sensitive element with the voltage across the second temperature sensitive element so as to provide at the output a voltage related to the difference between the voltages across the first and second temperature sensitive elements. Such an arrangement should enable a more sensitive determination of the temperature because the resistances of the two temperature sensitive elements vary in opposite directions with temperature thereby effectively amplifying the voltage change with temperature.

The second temperature sensitive element may be a simple pn junction device. However, in a preferred example, the second temperature sensitive element comprises a bipolar transistor connected to a reference voltage supply line and the other of its collector and emitter connected to one input of the comparator. The first temperature sensitive element comprises a resistor connected between the reference voltage supply line and the other input of the comparator. In the case of an npn transistor, the transistor may be connected in common-collector configuration. Such transistors have the advantage of being generally available in MOS technology and so are suitable for integration with power MOSFET and CMOS logic devices such as may typically be found in a smart power device.

Although in the example mentioned above, the bipolar transistor is 'diode-connected', connection of the base electrode to a separate reference voltage may allow for greater flexibility in, for example, the design of the comparator.

Generally, the comparator comprises third and fourth similar transistors each having first and second main electrodes and a control electrode and each being connected by its main electrode in series with a respective one of the first and second temperature sensitive elements, the control electrode of the fourth transistor being connected to the second main electrode and the control electrode of the third transistor and the output of the detecting means being provided at the first main electrode of the fourth transistor. Such a comparator can be relatively simple and compact. However, other forms of comparator, for example, a more conventional differential amplifier may be used although in such a case a feedback arrangement may be required to reduce the gain of the differential amplifier.

The first current source may comprise two similar transistors each having first and second main electrodes and a control electrode and each having its main electrodes connected in series with a respective one of the third and fourth transistors, a further transistor, similar to the two similar transistors, having first and second main electrodes connected in series with a current generator and a control electrode connected to one of its first and second main electrodes and to the control electrodes of the two similar transistors. The second current source may comprise two similar transistors each having first and second main electrodes and a control electrode and each having its main electrodes connected in series with a respective one of the first and second transistors, a further transistor, similar to the two similar transistors, having first and second main electrodes connected in series with a current generator and a control electrode connected to one of its first and second main electrodes and to the control electrodes of the two similar transistors. Generally, the further transistor of the first and second current sources will be provided by a single common transistor. Such a current generator arrangement can be physically realized in a compact manner which reduces the semiconductor area required for integration of the current generator arrangement.

The output of the temperature responsive circuit may provide a bias current for limiting the current passing through a power semiconductor device and the temperature sensitive device may be integrated close to the power semiconductor device. Of course, the entire temperature responsive circuit, with the exception of the current generator which may be a conventional current generator, may be integrated within the same semiconductor body as the power semiconductor device which may be a power MOSFET forming, for example, part of a smart power device.

BRIEF DESCRIPTION OF THE DRAWING

Embodiments of the invention will now be described, by way of example, with reference to the single FIGURE of the accompanying drawing which shows one example of a temperature sensitive circuit in accordance with the invention.

DESCRIPTION OF THE PREFERRED EMBODIMENTS

Referring now to the single FIGURE of the drawing, there is shown a temperature responsive circuit 100 comprising a temperature sensitive device 1, a first current source 2 provided in series with the temperature sensitive device 1 for generating a given current $I_1$, and detecting means 3 having an output 4 for providing a voltage signal $V_4$ which varies with the temperature sensed by the temperature sensitive device 1. A current-limiting arrangement 6 is connected to the output 4 of the detecting means 3 and comprises a current mirror having first and second similar transistors Q11 and Q7 with the main current path between first and second electrodes $S_7$ and $d_7$ of the second transistor Q7 providing an output current Iout of the circuit a second current source 5 provides for the current mirror with a current nI which is related to said given current I when the voltage at the output 4 of the detecting means 3 represents a temperature below a critical temperature $T_c$, and provides a current which reduces with an increase in temperature beyond the critical temperature $T_c$ to cause the output current of the circuit to fall with the increase in temperature beyond the critical temperature $T_c$.

In the example shown in the FIGURE, each of the first and second transistors Q11 and Q7 has respective first and second main electrodes $S_{11}, d_{11}, S_7, d_7$ and a control electrode $G_{11}, G_7$ with the control electrode $G_7$ of the second transistor being connected to one electrode d11 of the first and second main electrodes $d_{11}$ and to the control electrode $G_{11}$ of the first transistor Q11. The first electrode $d_7$ of the second transistor Q7 provides an output $I_{out}$ of the circuit and the second current source 5 is connected to the second main electrodes $S_{11}, S_7$ of the first and second transistors Q11 and Q7 for generating a current related to said given current $I_1$ for the first and second transistors Q11 and Q7. The first main electrode $d_{11}$ of the first transistor is connected via a resistance R2 to the output 4 of the detecting means 3 for causing the voltage at the control electrodes $G_7$ and $G_{11}$ of the first and second transistors Q11 and Q7 to alter with the output voltage $V_4$ of the detecting means 3 until at a critical temperature $T_c$ the current I through the resistance R2 falls below the given current $I_1$, whereupon the current through the resistance R2 and thus the current at the first main electrode $d_7$ of the second transistor Q7 falls with a further increase in temperature beyond the critical temperature $T_c$.

The temperature responsive circuit 100 shown in the single FIGURE will now be described in greater detail.

As illustrated, the circuit 100 has a positive voltage supply line 10 and a negative voltage supply line 11, usually another voltage supply fixed relative to the voltage supply on line 10 or possibly ground. A current generator 20 is connected between the supply lines 10 and 11 in series with the main electrodes $S_8$ and $d_8$ of an n-channel enhancement mode MOSFET Q8 which has its gate electrode $G_8$ connected to its drain electrode $d_8$. The current generator 20 thus forces a given current $I_1$ through the MOSFET Q8.

In this example, the first and second current sources 2 and 5 each comprise a pair of matched n-channel MOSFETs Q5 and Q4 and Q12 and Q10, respectively, having their gate electrodes $G_5, G_4, G_{12}$ and $G_{10}$ connected to the gate electrode $G_8$ of the MOSFET Q8 and their source electrodes $S_5, S_4, S_{12}$ and $S_{10}$ connected to the negative supply line 11. In this example, the MOSFETs Q5,Q4,Q12 and Q10 are all matched to the MOSFET Q8 and so act as current sources of a current of the value $I_1$ generated by the current generator 20. It is not, however, necessary that the MOSFETs Q4, Q5, Q10, Q12 and Q8 be matched as they could merely be similar, that is integrated so as to have a known ratio of junction areas. For simplicity of circuit design, it is preferred that Q4 and Q5 are matched to one another and that Q10 and Q12 are matched to one another.

In the example shown in the FIGURE, the temperature sensitive device 1 comprises a first temperature sensitive element R1 having a positive temperature coefficient of resistance, that is its resistance increases with temperature, and a second temperature sensitive element Q1 having a negative temperature coefficient of resistance, that is its resistance decreases with increasing temperature, to enable a more accurate detection of temperature changes. Each of the temperature sensitive elements R1 and Q1 is connected in series with the main electrodes of a respective one of the MOSFETs Q4 and Q5 forming the first current source.

The detecting means 3 in this example is in the form of a comparator which compares the voltage $V_3$ across the first temperature sensitive element R1 with the voltage $V_2$ across the second temperature sensitive element Q1 and provides at the output 4 a voltage $V_4$ related to the difference between these voltages $V_2$ and $V_3$.

The second temperature sensitive element Q1 is, in this example, provided in the form of an npn bipolar transistor which is connected in common collector configuration with its base electrode $B_1$ connected to a reference voltage and its emitter electrode $E_1$ connected to one input 3 of the comparator 31 while the first temperature sensitive element $R_1$ comprises a resistor connected between the reference voltage and the other input 32 of the comparator 3. Npn bipolar transistors in common-collector configuration can readily be provided using MOS technology which is of particular advantage where the circuit 100 is to be in integrated form.

As shown, the bipolar transistor Q1 is diode-connected, that is the base electrode $B_1$ is connected together with the collector electrode $C_1$ to the positive supply line 10 which thus provides the reference voltage. The base electrode may, however, be connected to a separate reference voltage which could allow for greater flexibility in the design of, for example, the comparator 3. As another possibility the second temperature sensitive element may be formed by a simple pn junction device.

In this example, the comparator 3 comprises the first current source 2, a first p-channel enhancement mode MOSFET Q2 having its main terminals $S_2$ and $d_2$ connected in series between the resistor $R_1$ and the MOSFET Q4 of the first current source 2 and a second p-channel enhancement mode MOSFET Q3 having its main terminals $S_3$ and $d_3$ connected in series between the bipolar transistor Q1 and the MOSFET Q5 of the first current source 2. The gate or control electrodes $G_2$ and $G_3$ of the MOSFETs Q2 and Q3 are connected together and to the drain $d_3$ of the MOSFET Q3.

The output 4 from the comparator 3 is taken from the drain $d_2$ of the p-channel MOSFET Q2 and is supplied via the resistor $R_2$ to the drain electrode $d_{11}$ of the first transistor Q11 of the current-limiting arrangement 6. The first transistor Q11 is, in this example, an n-channel enhancement mode MOSFET and is similar to the second transistor Q7 of the current-limiting arrangement, which is thus also an n-channel enhancement mode MOSFET Q7. The gate or control electrodes $G_{11}$ and $G_7$ of the MOSFETs Q11 and Q7 are connected to one another and to the drain electrode $d_{11}$ of the MOSFET Q11.

As mentioned above, the second current source 5 comprises in this example matched n-channel enhancement mode MOSFETs Q12 and Q10. The source and drain electrodes $S_{12}$ and $d_{12}$ of the MOSFET Q12 are connected in series with the source and drain electrodes $S_{11}$ and $d_{11}$ of the MOSFET Q11 which is itself connected in series with the resistor R2. The source and drain electrodes $S_{10}$ and $d_{10}$ of the MOSFET Q10 are similarly connected in series with the source and drain electrodes $S_7$ and $d_7$ of the MOSFET Q7 and the output current signal $I_{out}$ of the circuit 100 is taken from the drain electrode $d_7$ of the MOSFET Q7.

As will be explained below, the circuit 100 provides an output current $I_{out}$ which above a certain critical temperature $T_c$ decreases with temperature. In this particular example, the output current $I_{out}$ may be used as a bias current and may be supplied as a reference current to a further circuit which monitors the current flowing through an active semiconductor device and limits the maximum current through the active semiconductor device to a fixed multiple of the current $I_{out}$. The active semiconductor device (not shown) may be a power MOSFET which may be a vertical DMOSFET and may form part of a so-called 'smart-power' device, that is a device in which a power semiconductor is integrated, using compatible technology, with low voltage, typically CMOS, components providing a logic function and, for example, generating status signals such as overvoltage, short circuit warnings etc. for the power device.

In such an example, the entire temperature sensing circuit 100 may be integrated with the power semiconductor device (and any other desired logic circuitry) in the same semiconductor body so that, of course, the temperature sensitive elements R1 and Q1 are positioned sufficiently close to the power device to provide an accurate indication of its temperature. In an alternative arrangement, the temperature sensitive elements Q1 and R1 could be provided on top of the power semiconductor device. The current generator 20 may be provided as a conventional external component, but would be formed by a conventional circuit integrated with the circuit 100. Of course, if appropriate, one or more of the other components of the circuit 100 need not necessarily be integrated with the power device. For example, the circuit 100, with the exception of the temperature sensitive elements, could be provided as a separate integrated circuit.

The operation of the temperature responsive circuit 100 shown in the FIGURE will now be explained.

The external current source 20 forces current into the MOSFET Q8 and this current $I_1$ is mirrored in the MOSFETs Q4 and Q5 of the first current source 2 and the MOSFETs Q10 and Q12 of the second current source 5.

The current $I_1$ flows unimpeded through the p-channel MOSFET Q3 because, by virtue of the connection between its drain and gate electrodes, p-channel MOSFET Q3 acts as a diode. The voltage through the other p-channel MOSFET Q2 of the comparator 3 is, however, controlled by the voltage difference between its gate electrode $G_2$ and its source electrode $S_2$. As its gate electrode $G_2$ is connected to the drain electrode $d_3$ of the p-channel diode-connected MOSFET Q3, the voltage $V_{G2}$ at the gate electrode $G_2$ is related to the voltage $V_2$ at the source electrode $S_3$ of the diode-connected MOSFET Q3 and is just greater than one DMOS threshold voltage less than the voltage $V_2$ because of the presence of MOSFET Q3.

As the temperature sensed by the temperature sensitive device, for example the temperature of the power MOSFET in the case of the smart power device discussed above, increases, the resistance of resistor R1 increases while the effective resistance of the collector-base connected bipolar transistor Q1 decreases so that the voltage $V_2$ at the source electrode of the diode-connected p-channel MOSFET Q3 increases while the voltage $V_3$ at the source electrode $S_2$ of the p-channel MOSFET Q3 decreases.

As the voltage $V_3$ falls below the voltage $V_2$, the current flow through the MOSFET Q2 is reduced and MOSFET Q2 becomes increasingly switched off. The voltage at the output 4 of the comparator 3, that is the voltage at the drain electrode $d_2$ of the MOSFET Q2, will thus fall as the MOSFET Q4 of the first current source 2 tries to maintain the given current $I_1$.

The value of the resistor R1 is selected such that, below a first temperature $T_A$, the voltage at the output 4 of the comparator 3 approaches the voltage on the positive supply line 10 (minus the voltage drop across the resistor $R_1$ and the small drop across MOSFET Q2) while at a second higher temperature $T_B$ the voltage $V_4$ at the output 4 of the comparator 3 approaches the voltage on the negative supply line 11 (the voltage drop across MOSFET Q4 is small). The voltage $V_4$ at the output 4 of the comparator 3 decreases approximately linearly with temperature between the first and second temperatures $T_A$ and $T_B$.

The voltage $V_5$ at the gate electrodes $G_{11}$ and $G_7$ of the MOSFETs Q11 and Q7 is related to the voltage $V_4$ at the output 4 of the comparator 3 by the voltage divider formed by the resistor R2 and the MOSFETs Q11 and Q12 and decreases linearly with the voltage $V_4$ until a critical temperature $T_c$ is sensed by the temperature sensitive device 1. At this point, the voltage $V_5$ is no longer sufficient to maintain the MOSFETs Q10 and Q12 conducting and they will thus become increasingly switched off. The MOSFET Q12 can no longer maintain the current $nI_1$ (where $n=1$ when the MOSFET Q12 is matched to the MOSFET Q8) and thus starts to function as a voltage controlled low value resistance so that the voltage at the drain of the MOSFET Q12 approaches that of the negative supply line 11. The voltage $V_5$ thus becomes a non-linear function of the voltage $V_4$. The current source MOSFET Q12 can no longer maintain the current $I_1$ through the MOSFET Q11 and accordingly the current through the MOSFET Q11 reduces. This current is mirrored in the MOSFET Q7 and so the current through Q7 reduces with the current through Q11.

The output current signal $I_{out}$ at the drain electrode $d_7$ of the MOSFET Q7 is thus equal to $I_1$ (where $n=1$ when the MOSFETs Q8,Q4,Q5,Q10 and Q12 are matched) until the critical temperature $T_C$ is reached. As the sensed temperature increases beyond $T_C$ the current through MOSFET Q7 and thus the output current signal $I_{out}$ reduces linearly up to the second temperature $T_B$. Above, the second temperature $T_B$ the voltage $V_4$ is effectively zero and so the current flowing through the MOSFET Q7 is zero providing a zero output current signal effectively switching off the power semiconductor device.

The various temperatures $T_A, T_B, T_C$ are related by selecting the resistance R1 and the characteristics of the bipolar transistor Q1. Typically, where the device to be protected by the circuit 100 is a power MOSFET, then $T_A = 90°$ C., $T_B = 100°$ C. $T_C = 200°$ C.

A second temperature sensing circuit, for example, of the type described in EP-A-369530, which may be used to switch the power semiconductor device off when the second temperature sensing circuit senses a second critical temperature $T_{BA}$ between $T_c$ and $T_B$, for example, 170° C.

The temperature responsive circuit 100 thus provides at the current output $I_{out}$ a current output signal which varies with temperature so that, above a predetermined critical temperature $T_C$ sensed by the temperature sensing device 1, the current $I_{out}$ supplied at the circuit output $I_{out}$ reduces with temperature. This current output signal $I_{out}$ may be used to provide a reference current for a further circuit which monitors the current through an active semiconductor device and controls the maximum current through the active semiconductor device, for example, a power MOSFET, to be a fixed multiple of $I_{out}$ so that if the active semiconductor device is forced into a current-limiting mode due to certain overload conditions, the output signal from the temperature responsive circuit limits the maximum current which can flow through the active device and cause this maximum current to reduce with temperature, thereby enabling the temperature of the active semiconductor device to be maintained within safe operating limits.

It should be appreciated that the various transistors are embodied by simple transistors for the purposes of this description only. By analogy with principles well known from the construction of current mirror circuits, those skilled in the art will recognise that more complex transistor arrangements could be used. For example, each transistor Q2 to Q12 could comprise a plurality of transistors in so-called cascode or Darlington configurations to achieve higher gain.

Where appropriate, the MOSFETs used in the circuit 100 may be replaced by other suitable components, for example, bipolar transistors, and the active device may be a power device other than a power MOSFET, for example, a power bipolar transistor or thyristor or an insulated gate bipolar transistor. The active device could also be a lateral rather than a vertical device.

It will be appreciated that whereas the embodiments described herein contain MOSFETs of particular conductivity types, the inventive principle can equally be applied to circuits in which devices have the opposite conductivity type and signals have the opposite polarity, and to circuits using bipolar devices. It will also be appreciated that where a particular form of circuit has been shown for performing a function which is well known per se (for example, a differential amplifier or a current mirror), there may be many other circuits for performing the same function which can be used in place of those described.

From reading the present disclosure, other modifications and variations will be apparent to persons skilled in the art. Such modifications and variations may involve other features which are already known in the semiconductor art and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly, whether or not it relates to the same invention as presently claimed in any claim and whether or not it mitigates any or all of the same technical problems as does the present invention.

I claim:

1. A temperature responsive circuit comprising: a temperature sensitive device, a first current source connected in series with the temperature sensitive device for generating a given current, detecting means having an output for providing a voltage signal which varies with the temperature sensed by the temperature sensitive device, a current-limiting arrangement connected to the output of the detecting means, the current limiting arrangement comprising a current mirror having first and second similar transistors with a main current path between first and second electrodes of the second transistor providing an output current of the circuit and a second current source providing a current for the current mirror which is related to said given current when the voltage signal at the output of the detecting means represents a temperature below a critical temperature and providing a current which drops with an increase in temperature beyond the critical temperature to cause the output current of the circuit to fall with an increase in temperature beyond the critical temperature.

2. A temperature responsive circuit according to claim 1, wherein the first and second transistors each have first and second main electrodes and a control electrode and with the control electrode of the second transistor connected to the first main electrode and the control electrode of the first transistor, and with the first electrode of the second transistor providing an output of the circuit and the second current source connected to the second main electrodes of the first and second transistors, the first main electrode of the first transistor being connected via a resistance to the output of the detecting means for causing a voltage at the control electrodes of the first and second transistors to vary with the output voltage of the detecting means.

3. A temperature responsive circuit according to claim 1 wherein the temperature sensitive device comprises a first temperature sensitive element having a positive temperature coefficient of resistance and a second temperature sensitive element having a negative temperature coefficient of resistance and with each of the temperature sensitive elements connected in series with the first current source, and wherein the detecting means comprises a comparator for comparing a voltage across the first temperature sensitive element with a voltage across the second temperature sensitive element and for providing at the output of the detecting means said voltage signal and which is related to a difference between the voltages across the first and second temperature sensitive elements.

4. A temperature responsive circuit according to claim 3, wherein the second temperature sensitive element comprises a bipolar transistor having its base electrode and one of its emitter and collector electrodes connected to a reference voltage supply line and the other one of its collector and emitter electrodes connected to one input of the comparator, and wherein the first temperature sensitive element comprises a resistor connected between the reference voltage supply line and another input of the comparator.

5. A temperature responsive circuit according to claim 4, wherein the comparator comprises third and fourth similar transistors each having first and second main electrodes and a control electrode and each being connected in series with a respective one of the first and second temperature sensitive elements, the control electrode of the fourth transistor being connected to the second main electrode and the control electrode of the third transistor, and wherein the output of the detecting means comprises the first main electrode of the fourth transistor.

6. A temperature responsive circuit according to claim 5, wherein the first current source comprises two similar transistors each having first and second main electrodes and a control electrode and each having its main electrodes connected in series with a respective one of the third and fourth transistors, a further transistor similar to the two similar transistors of the first current source and having first and second main electrodes connected in series with a current generator and having a control electrode connected to one of its first and second main electrodes and to the control electrodes of the two similar transistors of the first current source.

7. A temperature responsive circuit according to claim 1 wherein the second current source comprises two similar transistors each having first and second main electrodes and a control electrode and each having its main electrodes connected in series with a respective one of the first and second transistors, and a further transistor similar to the two similar transistors and having first and second main electrodes connected in series with a current generator and having a control electrode connected to one of its first and second main electrodes and to the control electrodes of the two similar transistors of the second current source.

8. A temperature responsive circuit according to claim 1 wherein the output of the circuit provides a bias current for limiting the current passing through a power semiconductor device and in that the temperature sensitive device is integrated close to the power semiconductor device.

9. A temperature responsive circuit according to claim 2 wherein the temperature sensitive device comprises a first temperature sensitive element having a positive temperature coefficient of resistance and a second temperature sensitive element having a negative temperature coefficient of resistance and with each of the temperature sensitive elements connected in series with the first current source, and wherein the detecting means comprises a comparator for comparing a voltage across the first temperature sensitive element with a voltage across the second temperature sensitive element and for providing at the output of the detecting means said voltage signal and which is related to a difference between the voltages across the first and second temperature sensitive elements.

10. A temperature responsive circuit according to claim 9, wherein the second temperature sensitive element comprises a bipolar transistor having its base electrode and one of its emitter and collector electrodes connected to a reference voltage supply line and the other one of its collector and emitter electrodes connected to one input of the comparator, and wherein the first temperature sensitive element comprises a PTC resistor connected between the reference voltage supply line and another input of the comparator.

11. A temperature responsive circuit according to claim 10, wherein the comparator comprises third and fourth similar transistors each having first and second main electrodes and a control electrode and each being connected in series with a respective one of the first and second temperature sensitive elements, the control electrode of the fourth transistor being connected to the second main electrode and the control electrode of the third transistor, and wherein the output of the detecting means comprises the first main electrode of the fourth transistor.

12. A temperature responsive circuit according to claim 3, wherein the comparator comprises third and fourth similar transistors each having first and second main electrodes and a control electrode and each being connected in series with a respective one of the first and second temperature sensitive elements, the control electrode of the fourth transistor being connected to the second main electrode and the control electrode of the third transistor, and wherein the output of the detecting means comprises the first main electrode of the fourth transistor.

13. A temperature responsive circuit according to claim 12, wherein the first current source comprises two similar transistors each having first and second main electrodes and a control electrode and each having its main electrodes connected in series with a respective one of the third and fourth transistors, a further transistor similar to the two similar transistors of the first current source and having first and second main electrodes connected in series with a current generator and having a control electrode connected to one of its first and second main electrodes and to the control electrodes of the two similar transistors of the first current source.

14. A temperature responsive circuit according to claim 3 wherein the second current source comprises two similar transistors each having first and second main electrodes and a control electrode and each having its main electrodes connected in series with a respective one of the first and second transistors, and a further transistor similar to the two similar transistors and having first and second main electrodes connected in series with a current generator and having a control electrode connected to one of its first and second main electrodes and to the control electrodes of the two similar transistors of the second current source.

15. A temperature responsive circuit according to claim 4 wherein the second current source comprises two similar transistors each having first and second main electrodes and a control electrode and each having its main electrodes connected in series with a respective one of the first and second transistors, and a further transistor similar to the two similar transistors and having first and second main electrodes connected in series with a current generator and having a control electrode connected to one of its first and second main electrodes and to the control electrodes of the two similar transistors of the second current source.

16. A temperature responsive circuit according to claim 15 wherein the output of the circuit provides a bias current for limiting the current passing through a power semiconductor device and in that the temperature sensitive device is integrated close to the power semiconductor device.

17. A temperature responsive circuit according to claim 3 wherein the output of the circuit provides a bias current for limiting the current passing through a power semiconductor device and in that the temperature sensitive device is integrated close to the power semiconductor device.

18. A temperature responsive circuit comprising:
a temperature sensitive device having first and second current branches including first and second temperature sensitive elements having complementary temperature coefficients thereby to produce first and second temperature-dependent voltages,
a first current source having first and second current branches coupled in series with the first and second current branches of the temperature sensitive device to first and second terminals of a source of DC supply voltage,
current generator means coupled to said first current source for producing a given current in said first current source,
a detection circuit coupled to said temperature sensitive device and responsive to said first and second temperature dependent voltages to produce at its output a voltage signal that varies with the temperature sensed by the temperature sensitive device, and
a current limiter circuit coupled to the detection circuit output and comprising;
a current mirror circuit having first and second similar transistors,
a current output terminal coupled to the second transistor,
means coupling the first transistor to said output of the detection circuit, and
a second current source coupled to the current mirror circuit to provide a current for the current mirror circuit which is related to said given current when said voltage signal represents a sensed temperature below a critical temperature and further provides a current for the current mirror circuit which decreases for an increase in temperature above the critical temperature whereby an output current in the current output terminal decreases for said increase in temperature above the critical temperature.

19. A temperature responsive circuit as claimed in claim 18 wherein;
said first and second temperature sensitive elements have a positive temperature coefficient and a negative temperature coefficient, respectively, and
said second current source is coupled to said current generator means.

20. A temperature responsive circuit as claimed in claim 18 wherein;
said detection circuit comprises third and fourth transistors serially connected in said first and second current branches, respectively, with said first and second temperature sensitive elements, respectively, and
said first and second current sources form second and third current mirror circuits with said current generator means.

* * * * *

UNITED STATES PATENT AND TRADEMARK OFFICE
CERTIFICATE OF CORRECTION

PATENT NO. : 5,221,888

DATED : June 22, 1993

INVENTOR(S) : Paul T. Moody

It is certified that error appears in the above-indentified patent and that said Letters Patent is hereby corrected as shown below:

```
Column 4, line 30, change "a" to --.  A--;
         line 31, delete "for";
         line 45, delete "d₁₁" (last occurrence).
```

Signed and Sealed this

Tenth Day of May, 1994

Attest:

BRUCE LEHMAN

Attesting Officer      Commissioner of Patents and Trademarks